United States Patent [19]

Roesner et al.

[11] Patent Number: 5,572,400
[45] Date of Patent: Nov. 5, 1996

[54] PRINTED CIRCUIT BOARD FORM FACTOR AND MOUNTING CONCEPT FOR COMPUTER OR WORKSTATION INPUT AND OUTPUT

[75] Inventors: Arlen L. Roesner; Stuart Yoshida, both of Fort Collins, Colo.

[73] Assignee: Hewlett-Packard Co., Palo Alto, Calif.

[21] Appl. No.: 314,187

[22] Filed: Sep. 28, 1994

[51] Int. Cl.⁶ .................. G06F 1/16; H05K 7/02
[52] U.S. Cl. .............. 361/683; 361/684; 361/796; 361/802
[58] Field of Search ................ 361/683, 684, 361/685, 686, 724–727, 679, 732, 740, 747, 759, 785, 788, 796, 797, 799, 800, 801, 802, 803, 807, 809, 810; 439/64, 65, 76.1; 364/708.1

[56] References Cited

U.S. PATENT DOCUMENTS

| | | | |
|---|---|---|---|
| 4,922,192 | 5/1990 | Conover | 324/158 F |
| 5,043,847 | 8/1991 | Deinhardt et al. | 361/395 |
| 5,103,378 | 4/1992 | Stowere et al. | 361/415 |
| 5,162,675 | 11/1992 | Olsen et al. | 361/684 |
| 5,174,762 | 12/1992 | Hoppal | 439/61 |
| 5,224,020 | 6/1993 | Golledge et al. | 361/393 |
| 5,339,221 | 8/1994 | Conroy-Wass et al. | 361/796 |
| 5,386,346 | 1/1995 | Gleadall | 361/799 |
| 5,396,400 | 3/1995 | Register et al. | 361/686 |
| 5,430,615 | 7/1995 | Keeth et al. | 361/788 |
| 5,444,601 | 8/1995 | Honda et al. | 361/683 |

*Primary Examiner*—Leo P. Picard
*Assistant Examiner*—Lynn D. Feild
*Attorney, Agent, or Firm*—Cynthia S. Baan

[57] ABSTRACT

A computer chassis with a mother board and at least one slot opening in the back of the chassis and a daughter board attached to the chassis by a bulkhead. The bulkhead is slid into the slot opening in a self-aligning manner until the daughter board is mated to an electrical connector on the mother board. The bulkhead fits snugly into the slot opening due to side and bottom flaps on the bulkhead and wedge shaped springs on the sides of the slot opening. The top of the computer housing contains a feature to capture and hold a top edge of the daughter board against movement. The top of the computer housing also contains an EMI liner and spring clips that correspond to the top edge of the bulkhead and secures the bulkhead in the computer housing, thus providing consistent and improved EMI/RFI containment.

5 Claims, 11 Drawing Sheets

PRINTED CIRCUIT BOARD FORM FACTOR AND MOUNTING CONCEPT FOR COMPUTER OR WORKSTATION INPUT AND OUTPUT

FIELD OF THE INVENTION

The present invention relates generally to the field of computer and workstation electronic assemblies and more particularly to the mounting and arrangement of input/output printed circuit boards within the computer or workstation housing.

BACKGROUND OF THE INVENTION

Currently it is desirable in the computer and workstation industry to decrease the size and weight of computers and workstations, while increasing the system capabilities. Modern personal computers and workstations generally have a means for adding additional circuit boards or daughter boards to the base system or the mother board. Insertion and removal of daughter boards also usually requires removal of a computer housing and the locating and removal of multiple screws or other fasteners. Removal and fastening of screws or other fasteners inside the computer housing can be extremely complicated, especially since the density of components is ever increasing and the size of the housing is ever decreasing. Typically, these add-on circuit boards are an additional factor in increasing the overall height, size and weight of computers and workstations. Another issue that needs to be addressed with regards to any I/O (input/output) boards, such as a video card, is the containment of EMI or RFI (electro-magnetic interference and radio frequency interference) inside the computer or workstation housing.

Accordingly, it would be advantageous to have a means for adding additional circuit boards to a computer or workstation system that does not add significantly to the height and weight of the overall assembly. It would be another advantage to have a means for rapid insertion and removal of additional circuit boards to a computer or workstation assembly that is a self-aligning, self-mounting means and does not require the labor or weight associated with multiple screws or other types of fasteners. It would be a further advantage to have a means for adding I/O cards to a computer or workstation assembly that provides improved EMI/RFI containment within the assembly.

SUMMARY OF THE INVENTION

The present invention improves computer or workstation assembly mechanical design by providing a convenient system for adding and removing additional circuit boards to the computer assembly without requiring difficult and time consuming location and removal of screws or other fasteners. The present invention permits computer housings to be designed with lower vertical heights while avoiding the cost of additional printed circuit board mounting features and fastening hardware. The present invention also improves the ability and consistency of containing EMI/RFI radiation within the computer housing, especially around the daughter board mounting positions.

The present invention comprises a computer chassis with a mother board and at least one slot opening in the back of the chassis and a daughter board attached to the chassis by a bulkhead. The bulkhead is slid into the slot opening in a self-aligning manner until the daughter board is mated to an electrical connector on the mother board. The bulkhead fits snugly into the slot opening due to side and bottom flaps on the bulkhead and wedge shaped springs on the sides of the slot opening. The top of the computer housing contains a feature to capture and hold a top edge of the daughter board against movement. The top of the computer housing also contains an EMI liner and spring clips that correspond to the top edge of the bulkhead and secures the bulkhead in the computer housing, thus providing consistent and improved EMI/RFI containment.

DETAILED DESCRIPTION OF THE PREFERRED EMBODIMENT

Figure 1:
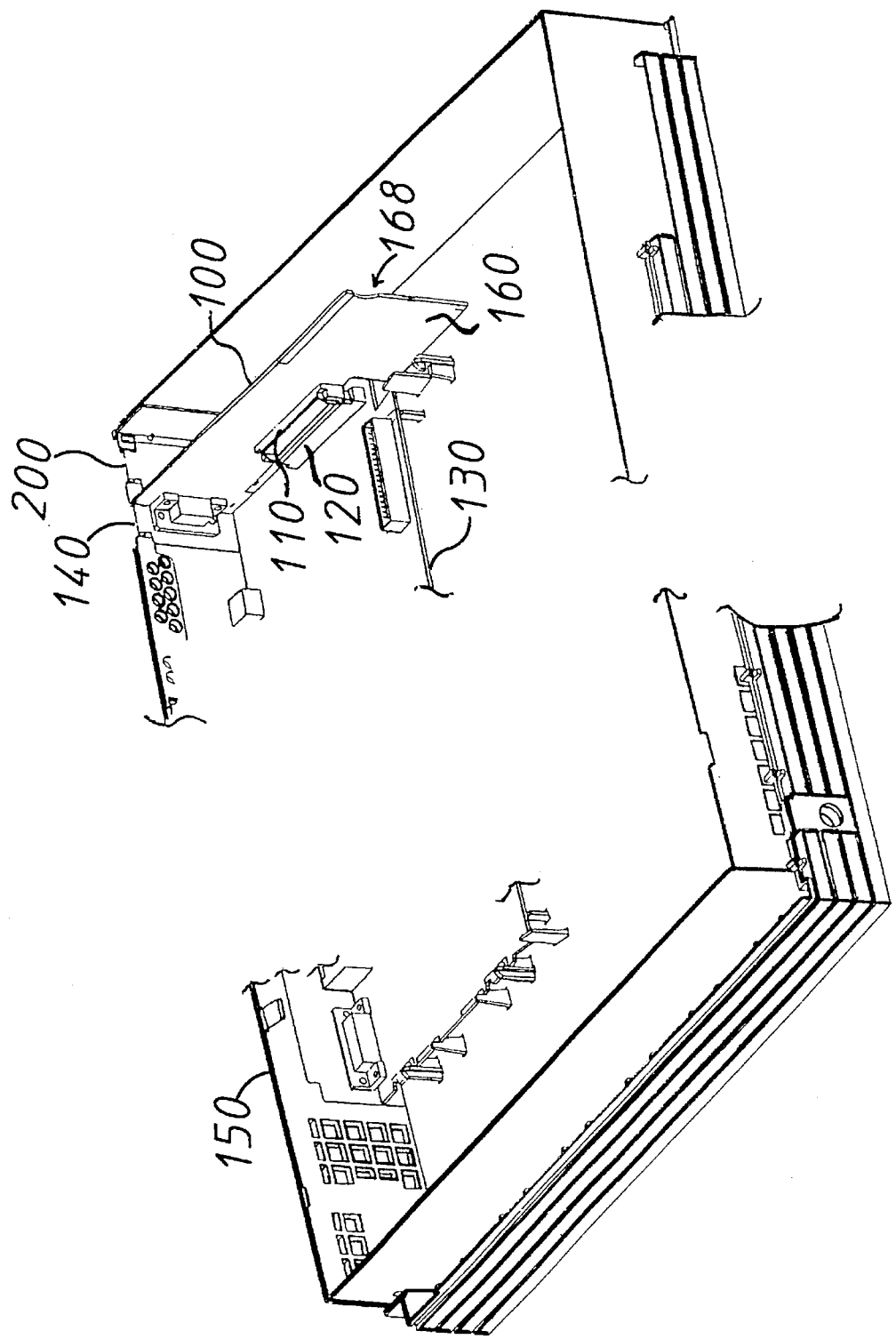
FIG. 1 shows a top, front perspective view of the inside of a computer assembly according to the present invention.

FIG. 1 shows a top, front perspective view of a computer chassis 150 with a mother board 130 and a daughter board 100. Computer chassis can be made of any known computer housing material, such as pre-plated cold-rolled steel. The daughter board 100 comprises a printed circuit board 160 which can be any known type of printed circuit board. Printed circuit board 160 contains various electronic components (not shown) and a connector 110 that is electrically connected to the mother board 130 via a connector 120 on the mother board. Connectors 110 and 120 can be any known electrical connectors, such as an Eurocard Din Connectors (right angle daughter card connector to vertical mother board connector). The daughter board 100 is preferably even with the top of computer housing 150. Daughter board 100 can extend beyond the length and depth of the mother board 130 as seen at end 168 of daughter board 100. Daughter board 100 also has a bulkhead 149, which enables the daughter board 100 to be mounted in computer housing 150.

Figure 2:
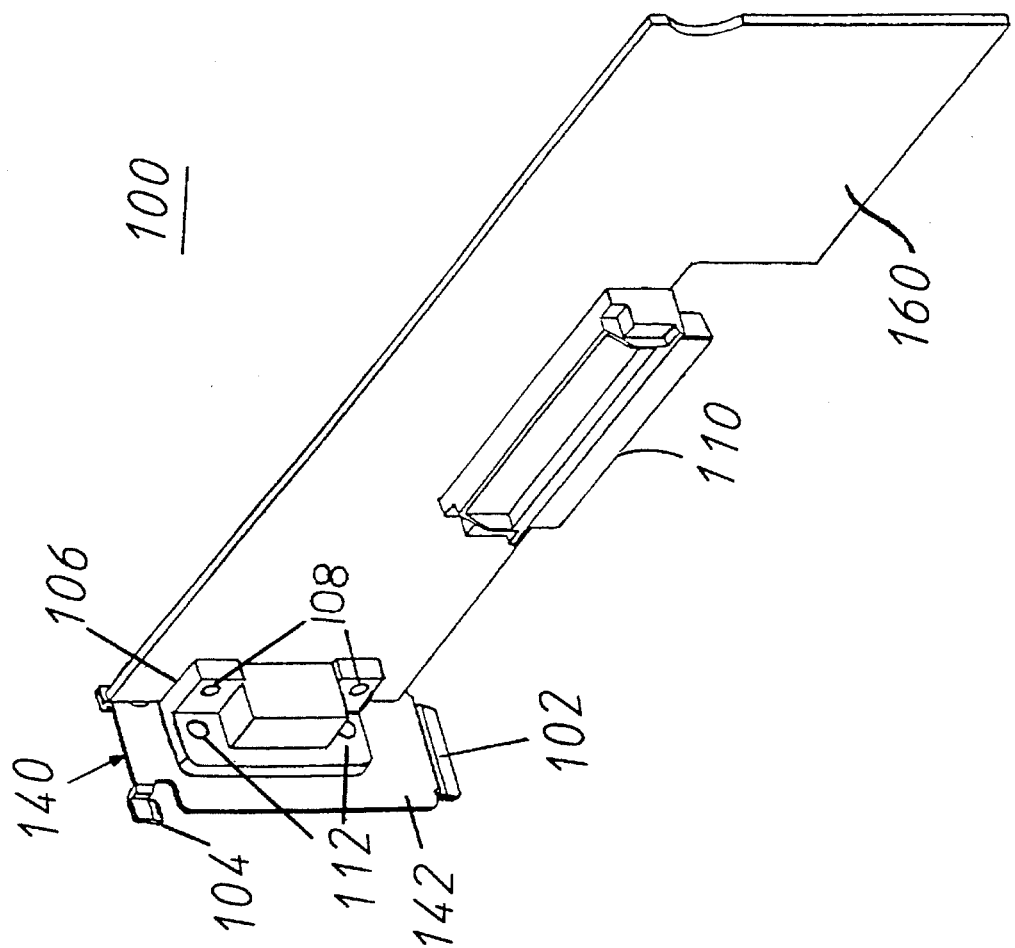
FIG. 2 shows a top, back perspective view of a daughter board according to the present invention.
Figure 3:
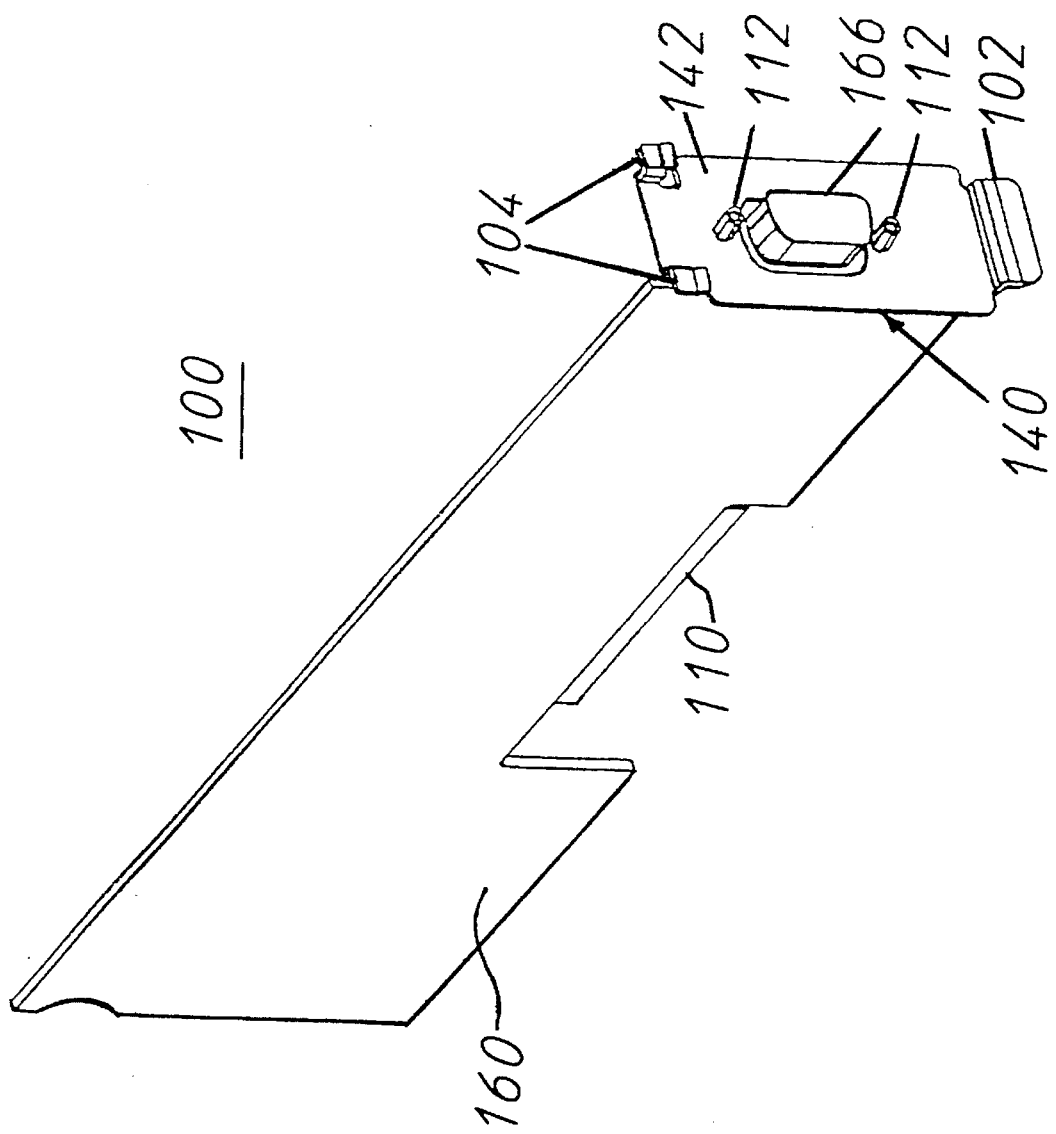
FIG. 3 shows a top, front perspective view of a daughter board according to the present invention.
Figure 4:
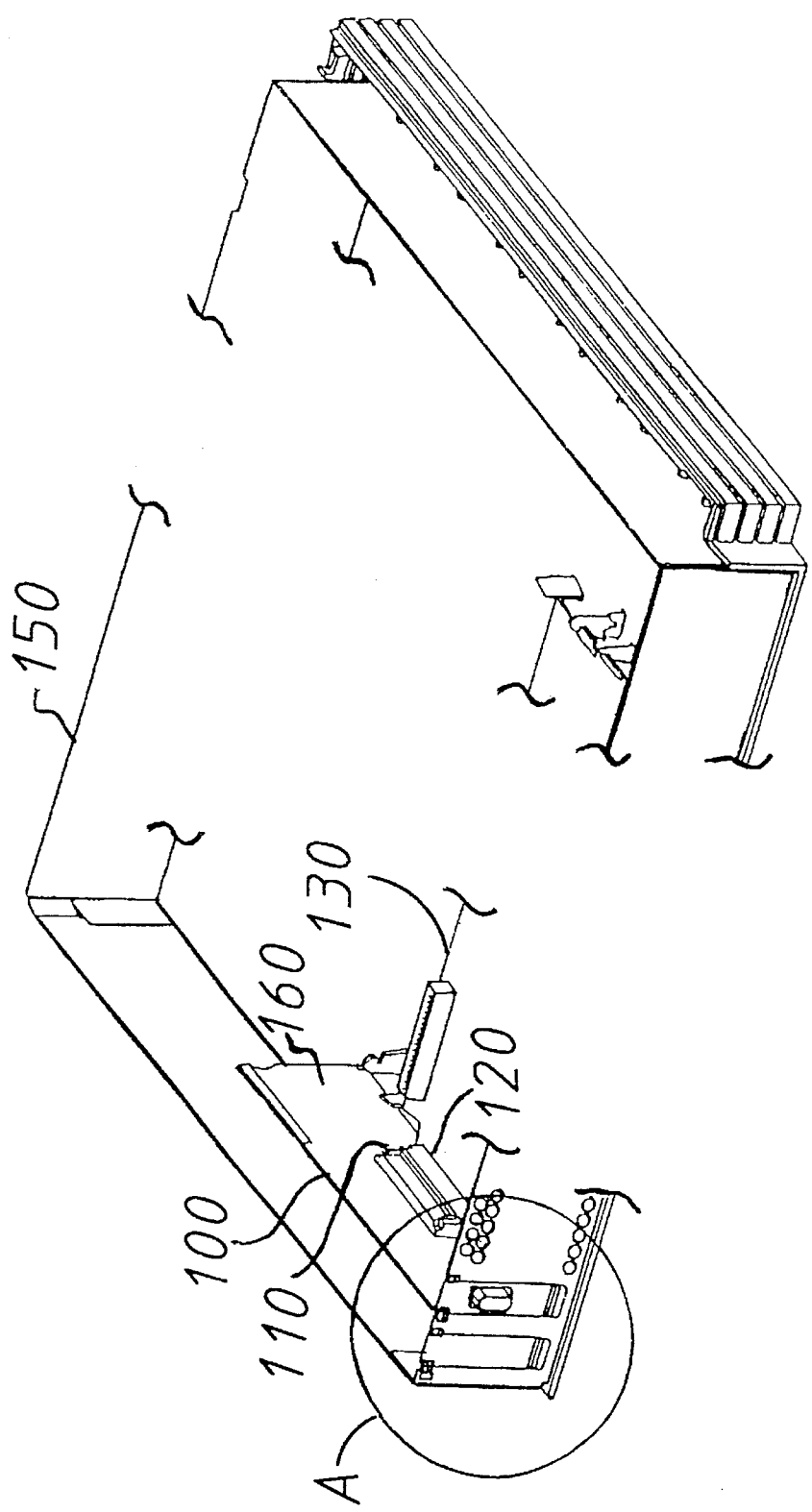
FIG. 4 shows a top, back perspective view of the inside of a computer assembly according to the present invention.
Figure 5:
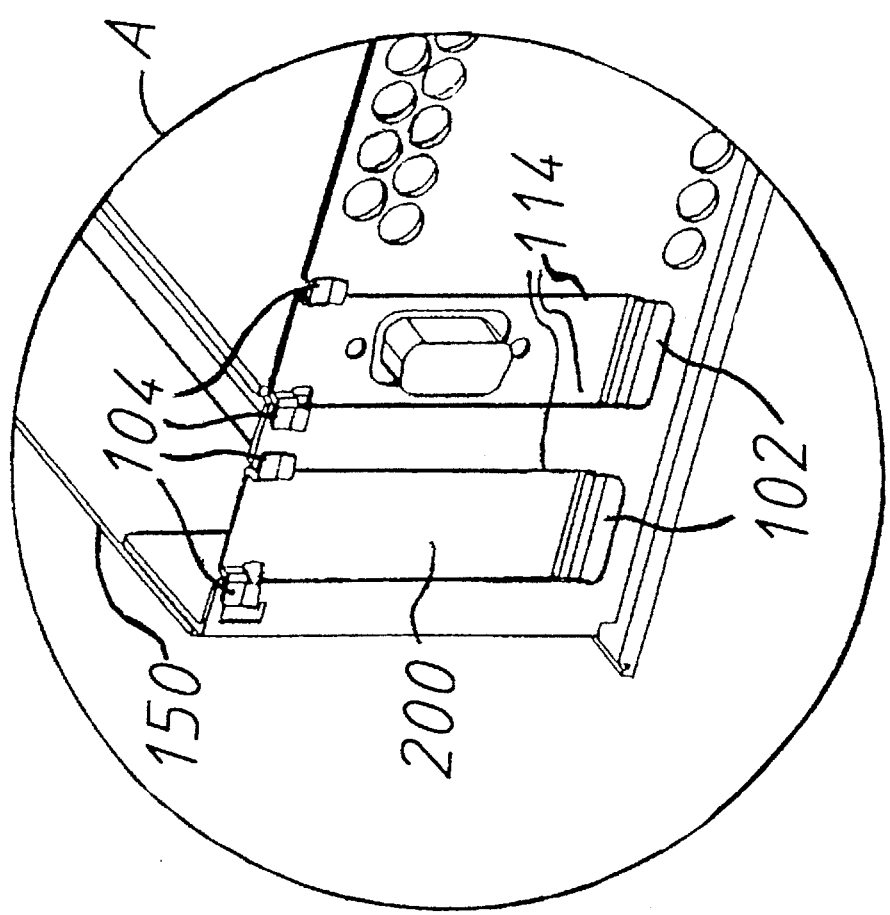
FIG. 5 shows a blown-up perspective view of detail A according to the present invention as shown in FIG. 4.
Figure 6:
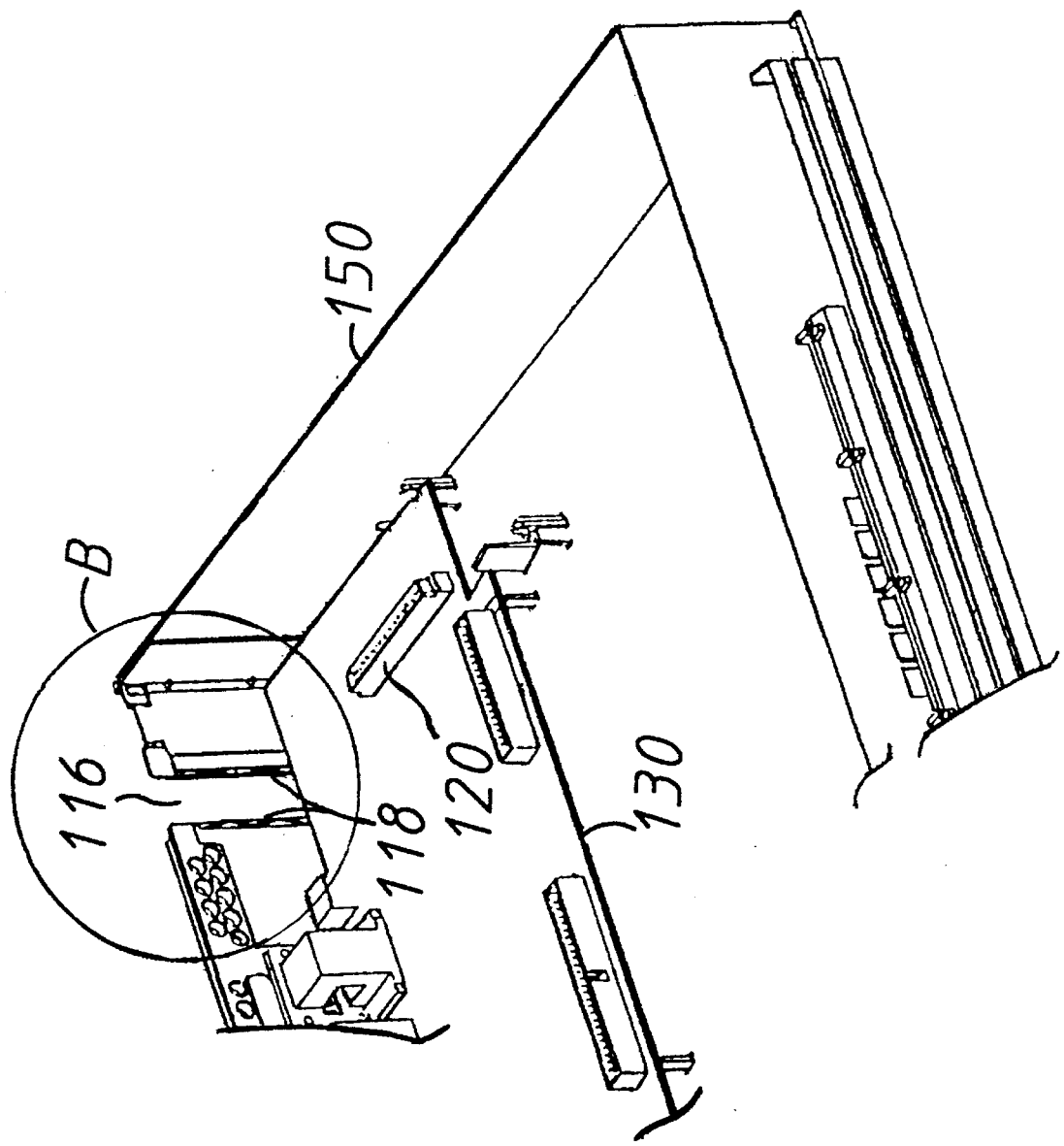
FIG. 6 shows a top, front perspective view of the inside of a computer assembly according to the present invention.
Figure 7:
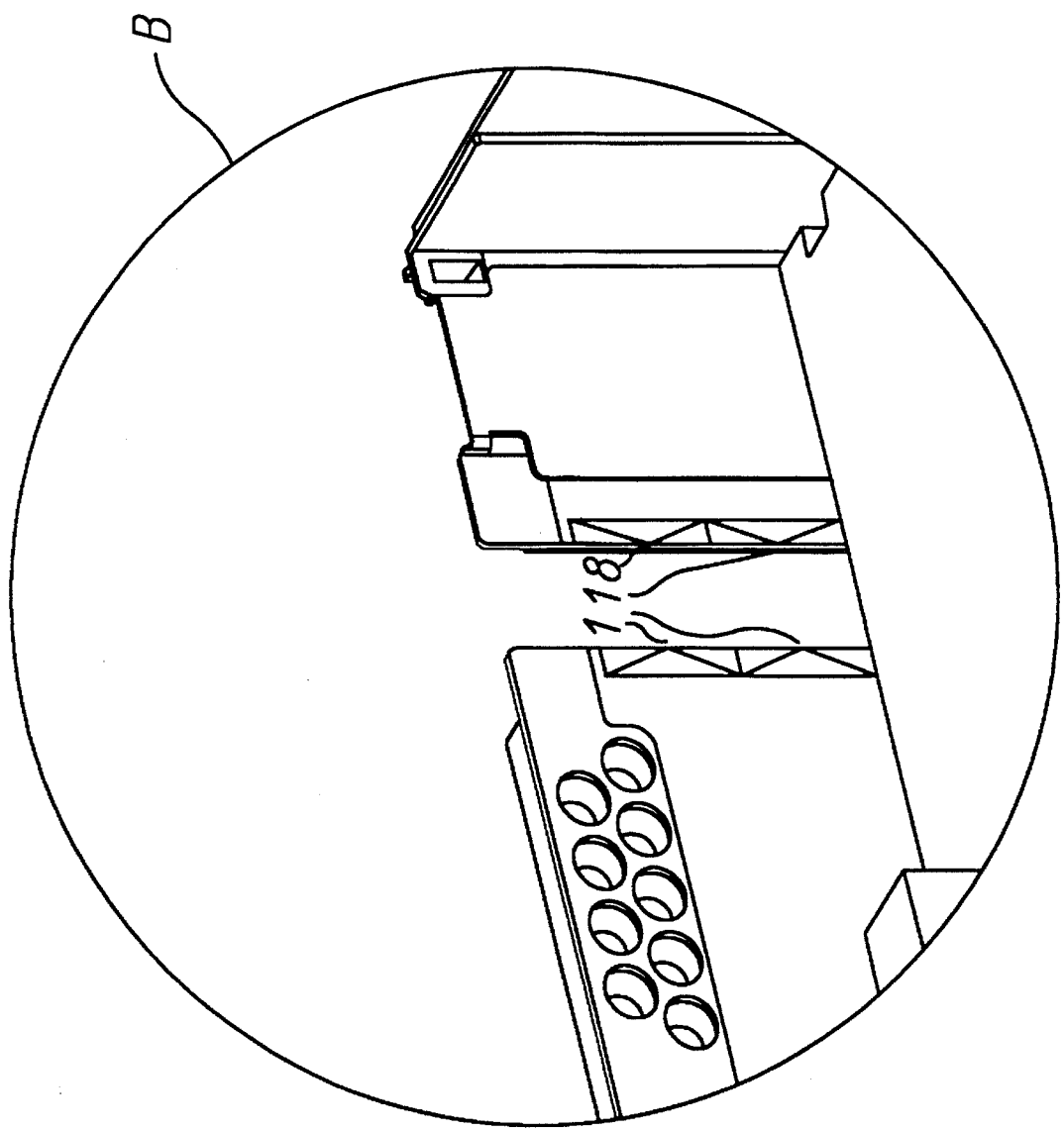
FIG. 7 shows a blown-up perspective view of detail B according to the present invention as shown in FIG. 6.
Figure 9:
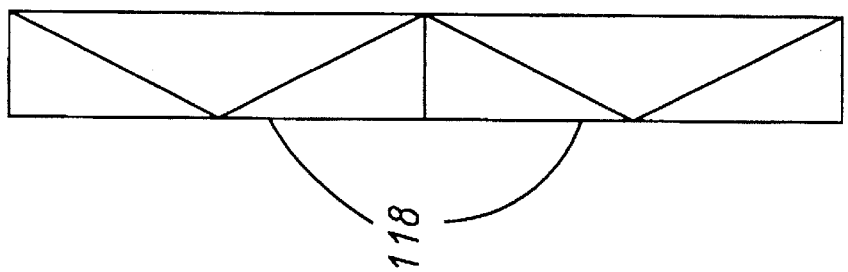
FIG. 9 shows a front view of a wedge spring according to the present invention.
Figure 8:
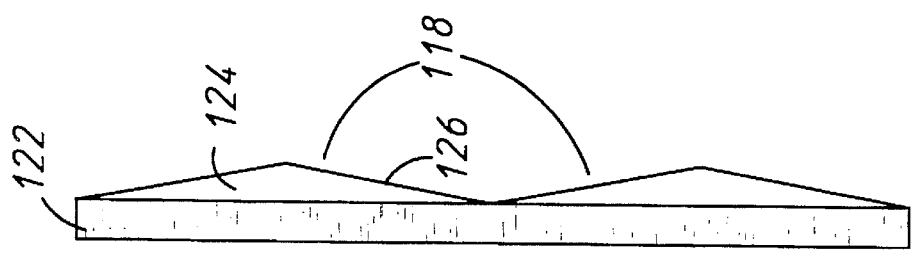
FIG. 8 shows a side view of a wedge spring according to the present invention.

FIGS. 2 and 3 show closer views of daughter board 100 which is comprised of printed circuit board 160, electrical connector 110 and bulkhead 140. Daughter board 100 is connected to bulkhead 140 by screws 108 or other known fastening means to an external cable connector 106 which is then screwed or otherwise fastened to bulkhead 140 by fastening means 112. Bulkhead 140 also has room for a switch, button, dial or other means for external input at 166. Bulkhead 140 has a main plate 142, two side flaps 104 and a bottom flap 102. Bulkhead 140 is preferably made of stamped steel that is pre-plated with zinc or post-plated with a chromate conversion coating. Flaps 102 and 104 are bent in such a manner that plate 142 locks on the inside of computer housing 150 and flaps 102 and 104 locks on the outside of computer housing 150, thereby mountably securing daughter board 100 to computer housing 150, as seen in FIGS. 1, 4 and 5. FIGS. 4 and 5 also show that there can be more than one slot in the back of computer housing 150. If a particular slot is not in use, a blank plate 200 can be mounted and secured in that slot in order to seal the computer housing against EMI/RFI leakage. The bulkhead creates a tight fit against the computer housing 150 at side walls 114 to further contain EMI/RFI leakage.

FIGS. 6 through 9 show wedge shaped springs 118 which are on the inside walls of either side of slot 116 in the computer chassis wail 122. Wedge shaped springs 118 are very small rectangular pockets that are formed of any thin elastic spring metal such as half-hard steel or beryllium copper. Wedge shaped springs 118 are formed by bending metal rectangle 126 to create three triangles such that a small pocket 124 is formed when metal rectangle is mounted to computer chassis wall 122 along three sides of rectangle 126. Accordingly, when bulkhead 140 is slid into slot 116 of computer housing 150 with flaps 102 and 104 on the outside of computer wall 122 and plate 142 on the inside of computer chassis wall 122, a snug fit is created between computer chassis wall 122 and bulkhead plate 142 via wedge shaped springs 118 which are on the inside of computer chassis wall 122. Wedge shaped springs 118 provide a pressure contact and take up the slack of the flatness tolerance that will necessarily be present in manufacturing.

Figure 10:
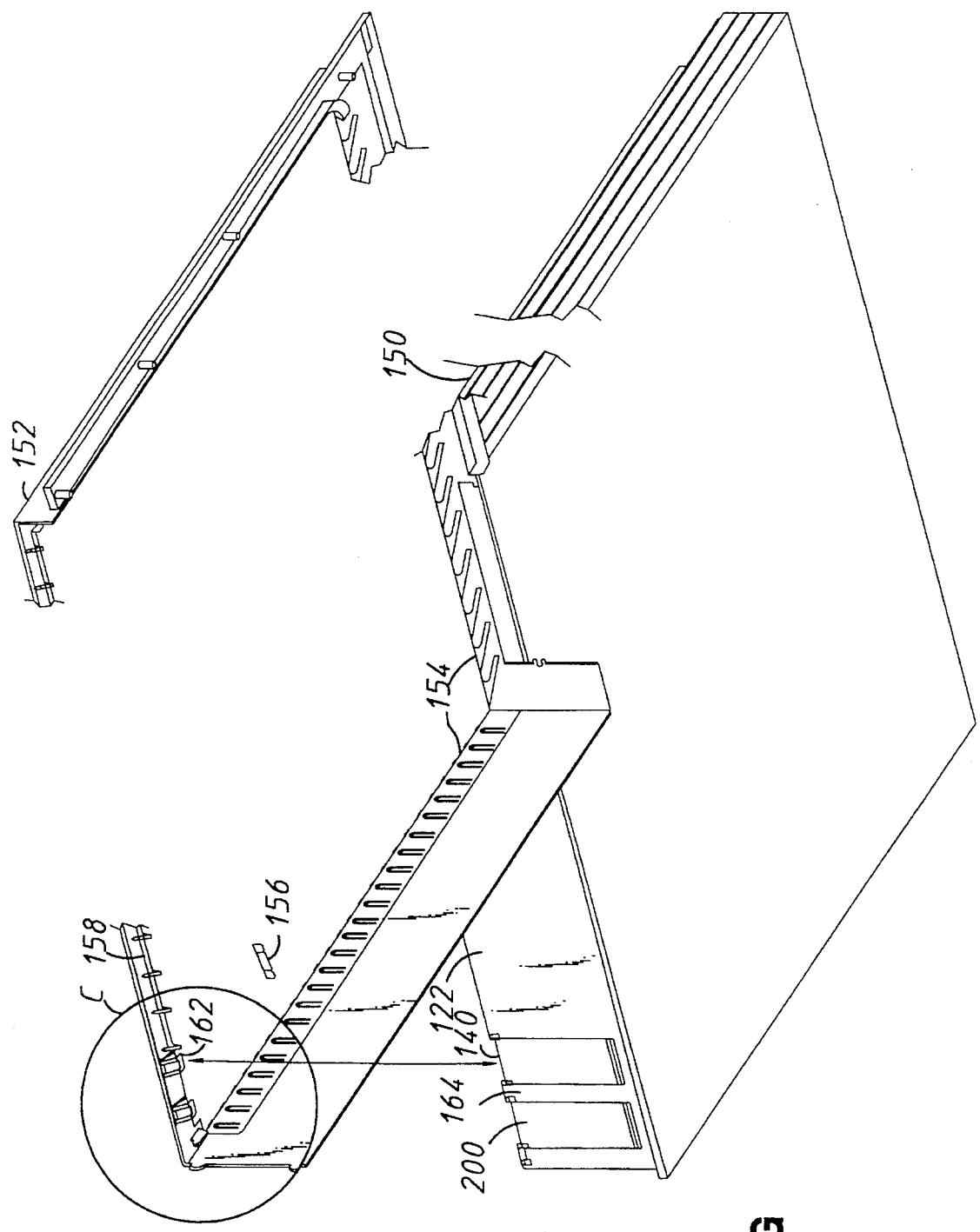
FIG. 10 shows a bottom, back perspective view of a computer assembly and computer cover according to the present invention.
Figure 11:
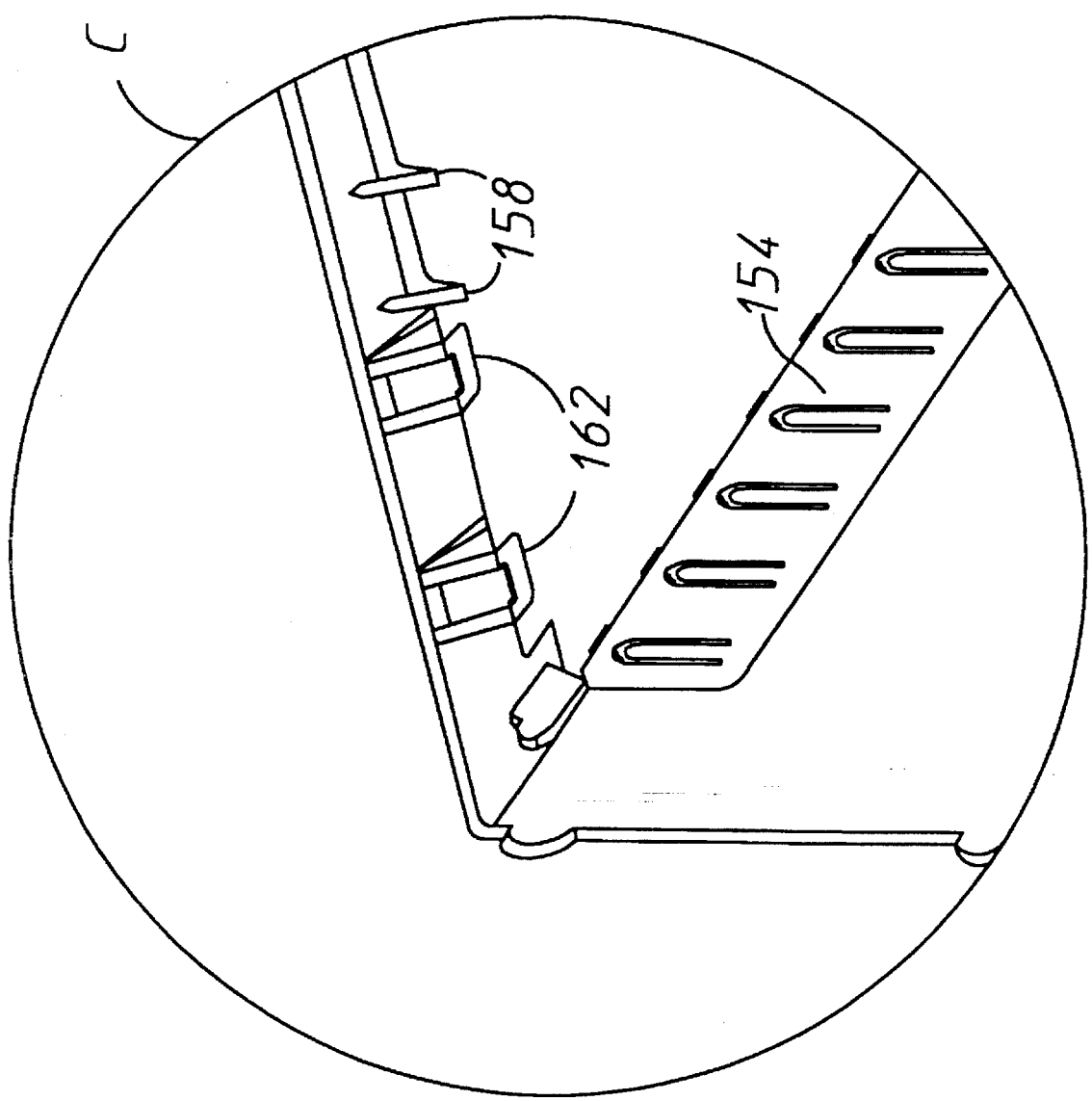
FIG. 11 shows a blown-up perspective view of detail C according to the present invention as shown in FIG. 10.

FIGS. 10 and 11 show computer chassis 150 and computer chassis cover 152. After bulkhead 140 which includes a daughter board 100 (not shown here) and any blank bulkheads 200 are snugly slid into slots 116 in computer chassis wall 122, computer chassis cover 152 is secured into place on computer chassis 150 by a snap fit, screws, or other known mounting hardware. Computer chassis cover 152 can preferably include a feature 156 that aligns with and captures a top edge of daughter board 100, thus securing the daughter board 100 against movement. Feature 156 is preferably a hard plastic or other hard material, such as metal. Computer chassis cover 152 EMI/RFI containment liners 154 and 158 as are well known in the computer field. Computer chassis cover 152 may preferably contain spring clips 162 that align with and secure bulkheads 140 and 200 against sliding upward. It should be noted that bulkheads 140 and 200 preferably are flush with the top surface of computer chassis wall 122. Spring clips 162 are made of a spring hard material such as half-hard steel or beryllium copper. Daughter board 100 should preferably be equal in height with the computer chassis wall once mounted to the mother board 130. Thus, once computer chassis cover 152 is mounted to computer chassis 150, spring clips 162 will secure bulkheads 140 and 200 against upward movement and feature 156 inside of computer chassis cover 162 will secure daughter board 100 against lateral bending and movement.

Figure 12:
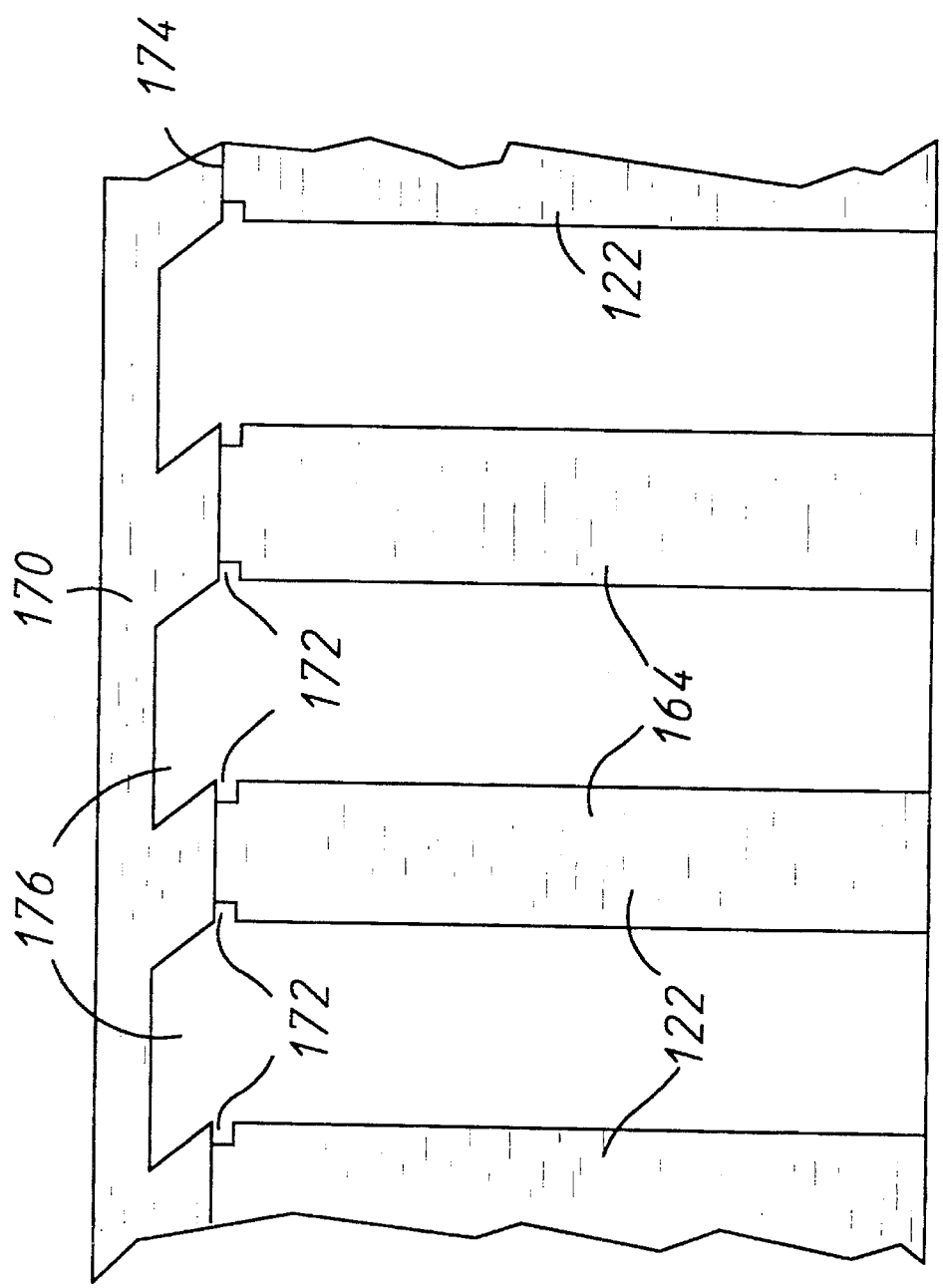
FIG. 12 shows a second embodiment of the computer housing assembly of the present invention.

FIG. 12 shows a second embodiment of the present invention. Specifically, if more than two daughter boards are used in a computer assembly, there will be a need for more than one flange member 164 (FIG. 10). In a situation with more than one flange member, the inventors have discovered that the structural support of the computer chassis wall 122 becomes weakened. In order to solve this problem, it would be advantageous to form the back wall of the computer chassis with a ledge 170 that has a bend 174 in it. Ledge 170 should contain slots 176 that extend into slots 116 (shown in FIG. 6) between flange members 164. Flange members 164 and corresponding side walls 122 have notches 172 at bend 174. Notches 172 allow bulkheads 140 and 200 (shown in FIG. 10) to slide into slot 116 (shown in FIG. 6) and corresponding slot 176 permits external hardware (112 or 166) shown in FIG. 3 of bulkhead 140 to slide past ledge 170. Accordingly, more than two bulkheads 140 and 200 (shown in FIG. 10) can be utilized without sacrificing the structural integrity of the computer chassis 150.

The foregoing description of the present invention has been presented for purposes of illustration and description. It is not intended to be exhaustive or to limit the invention to the precise form disclosed, and other modifications and variations may be possible in light of the above teachings. For example, bulkhead 140 can be made of any stiff, EMI safe material, rather than just steal. Moreover, the daughter boards could be mounted in a horizontal manner without deviating from the present invention. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A computer assembly comprising:

a computer chassis having four walls and a bottom, said computer chassis having at least one slot in at least one wall;

a mother board mounted inside said computer chassis;

an electrical connector mounted to said mother board; and at least one daughter board having a bulkhead that mounts in said at least one slot of said computer chassis, said bulkhead having flaps that slidingly secure said bulkhead to said computer chassis wall in a snug manner, said flaps slidingly mating to said at least one slot on the opposite side of said computer chassis wall as said bulkhead when said bulkhead is secured to said computer chassis, said flaps allowing said at least one daughter board and said bulkhead to self-locatingly mate with said mother board, said flaps securing said at least one daughter board and said bulkhead against movement within said computer chassis, said at least one daughter board being electrically connected to said mother board via said electrical connector when completely mounted in said at least one slot.

2. The computer assembly according to claim 1 wherein said at least one slot in said at least one wall of said computer chassis comprises a pair of wedge shaped springs that provide a pressure contact to said bulkhead.

3. The computer assembly according to claim 1 wherein said computer chassis further comprises a computer chassis cover, said computer chassis cover comprising at least one spring clip, said at least one spring clip being aligned with and securing said bulkhead against upward movement when said at least one daughter board is mounted in said at least one slot of said computer chassis and said computer chassis cover is secured to said computer chassis.

4. The computer assembly according to claim 3 wherein said computer chassis cover further comprises a means for securing a top edge of said at least one daughter board against lateral movement within said computer chassis.

5. The computer assembly according to claim 1 wherein said at least one daughter board is perpendicular to said mother board when said mother board is mounted in said computer chassis and said at least one daughter board is mounted in said at least one slot.

\* \* \* \* \*